United States Patent [19]

Moon

[11] Patent Number: 5,796,161
[45] Date of Patent: Aug. 18, 1998

[54] WINDOW CLAMP AND METHOD OF ALIGNEMENT OF LEAD FRAME STRIP UTILIZING THE SAME

[75] Inventor: Young Kiu Moon, Kyungki-Do, Rep. of Korea

[73] Assignee: Hyundai Electronics Industries Co., Ltd., Kyungki-Do, Rep. of Korea

[21] Appl. No.: 698,391

[22] Filed: Aug. 15, 1996

[30] Foreign Application Priority Data

Aug. 17, 1995 [KR] Rep. of Korea .................. 1995-25229

[51] Int. Cl.$^6$ .................................................. H01L 23/495
[52] U.S. Cl. .................... 257/676; 295/49.1; 295/49.5; 295/105; 295/44.7
[58] Field of Search .......................... 228/212, 44.7, 228/49.1, 49.5, 904, 180.5, 105, 4.5; 437/206; 257/676

[56] References Cited

U.S. PATENT DOCUMENTS

| | | | |
|---|---|---|---|
| 4,049,903 | 9/1977 | Kobler | 174/68.5 |
| 5,035,034 | 7/1991 | Cotmey | 29/25.01 |
| 5,186,719 | 2/1993 | Egashira et al. | 29/25.01 |
| 5,249,726 | 10/1993 | Sato | 228/44.7 |

*Primary Examiner*—Jerome Jackson
*Assistant Examiner*—Nathan K. Kelley
*Attorney, Agent, or Firm*—Fish & Richardson P.C.

[57] ABSTRACT

The present invention relates to a window clamp and a method of alignment of lead frame strip utilizing the same and, more particularly, to a window clamp and method of alignment of lead frame strip utilizing the same which makes the alignment of the lead frame strip precise, fast and increases yield by sensing an alignment condition of a die and a lead frame by utilizing a window clamp formed with a bonding window and a lead sensing window and by utilizing a sensing means set on a wire bonding equipment to prevent the occurrence of poor quality at the time of wire bonding due to misalignment of the lead frame strip.

4 Claims, 7 Drawing Sheets

WINDOW CLAMP AND METHOD OF ALIGNEMENT OF LEAD FRAME STRIP UTILIZING THE SAME

BACKGROUND OF THE INVENTION

1. Field of the invention

The present invention relates to a window clamp and a method of alignment of lead frame strip utilizing the same and, more particularly, to a window clamp and method of alignment of lead frame strip utilizing the same which can prevent the occurrence of poor quality at the time of wire bonding by sensing an alignment condition of a die and a lead frame by utilizing a window clamp formed with a bonding window and a lead sensing window and by utilizing a sensing means set on a wire bonding equipment.

2. Information Disclosure Statement

In general, a packaging process on a process of manufacturing a semiconductor device is mainly divided into a die attach process for attaching each die separated from a wafer onto a die attaching region of a lead frame, a wire bonding process for connecting the die and outer leads of the lead frame and molding process for forming a package body which protects the die and bonded wires. The wire bonding process for connecting the die and the outer leads of lead frame is performed with a wire bonding equipment, and the wire bonder senses an alignment condition of a lead frame strip formed with a plurality of lead frames before performing the wire bonding. The alignment of the lead frame strip is extremely important since an error occurs in a process of sensing the alignment condition of the lead frame strip and loss can be caused by the poor quality if the wire bonding is proceeded in the presence of error. The structure of lead frame strip is described with FIG. 1 before describing the general method of alignment of lead frame strip, and the prior art window clamp which is placed on the lead frame strip at the time of wire bonding is described with reference to FIG. 2A and FIG. 2B.

Figure 1:
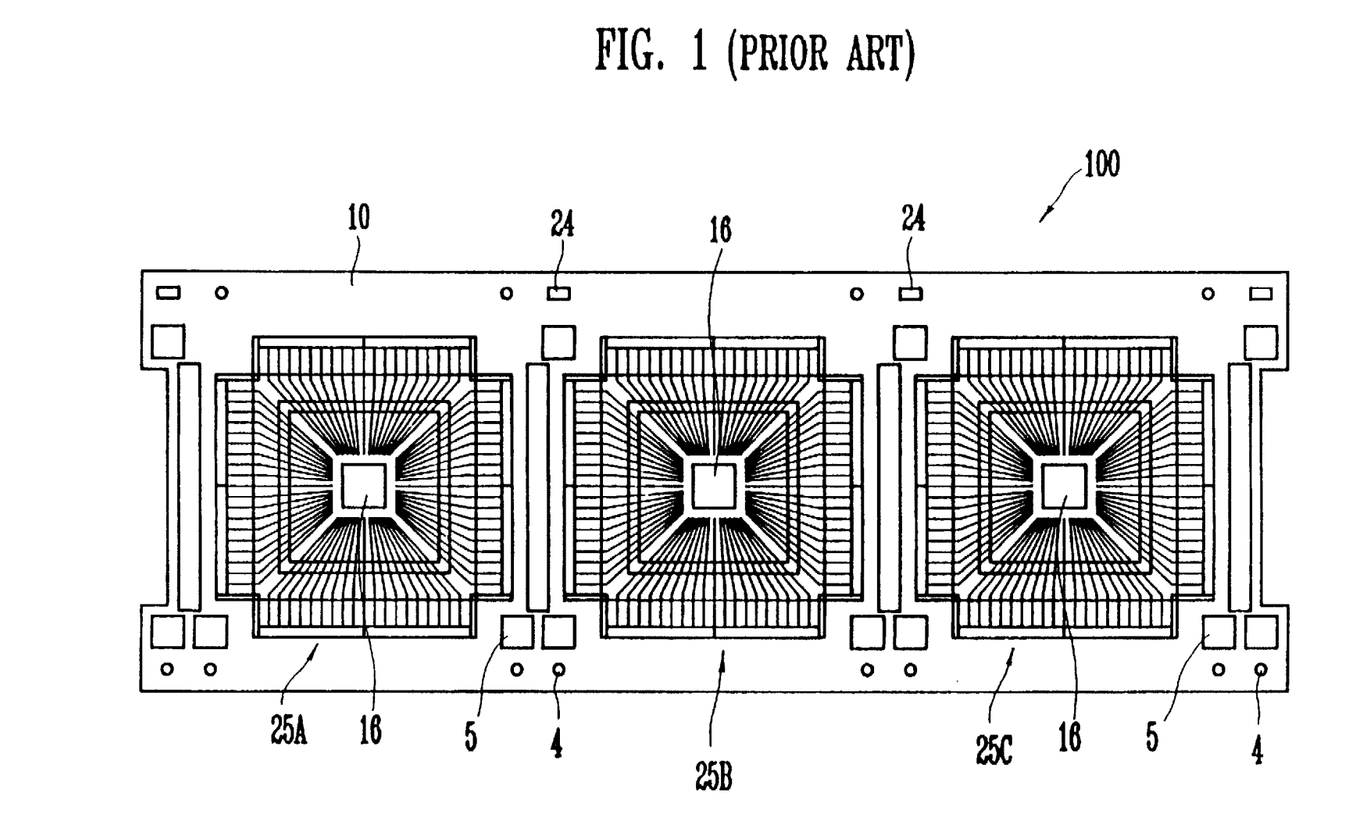
FIG. 1 is a plan view of a general type lead frame strip.

As shown in FIG. 1, a typical lead frame strip 100 consists of a plurality of lead frames 25A, 25B and 25C, a pair of side rails 10 formed at the upper and lower portion of lead frames 25A, 25B and 25C for integrating the lead frames 25A, 25B and 25C, a plurality of circular pin holes 4 and rectangular pin holes 24 formed on the side rails 10 at a constant spacing and a plurality of gate holes 5. Each of lead frames 25A, 25B and 25C consists of a die attaching region 16 formed at the central portion thereof to attach a die separated from a wafer and a plurality of leads. Such lead frame strip 100 can have various shape if needed, however, in the present specification, the lead frame strip 100 of general shape as shown in FIG. 1 is described.

Figure 2A:
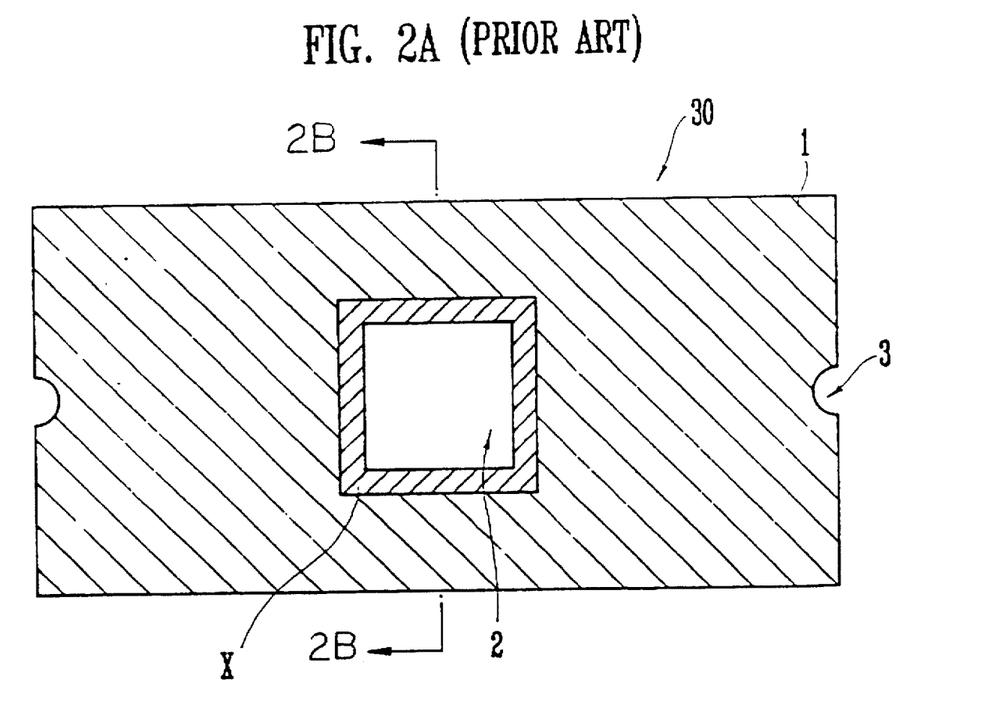
FIG. 2A is a plan view of a conventional window clamp.
Figure 2B:
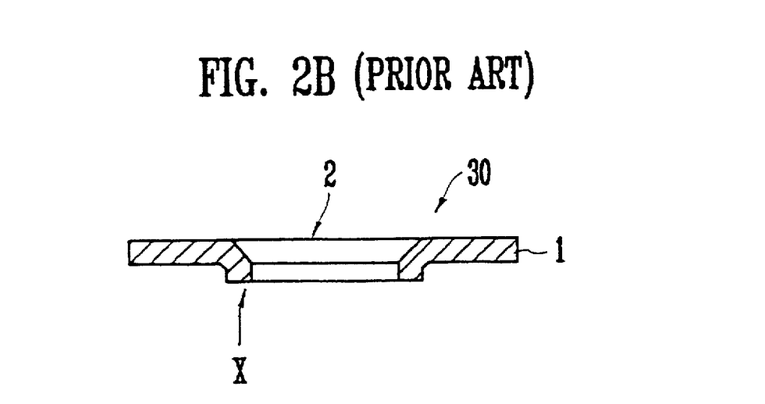
FIG. 2B is a cross sectional view taken along line A—A' of FIG. 2A.

As shown in FIG. 2A, a window clamp 30 of prior art consists of a flat portion 1 for covering a lead frame, for example 25B and a part of other lead frames 25A and 25C formed at both sides of the lead frame 25B, a bonding window 2 formed at the center of the flat portion 11 to expose the die attaching region 16 and a plurality of inner lead of the lead frame 25B, two fixing recesses 3 formed at both side ends of the flat portion 1. An inner side of the bonding window 2 is protruded downwards as shown in FIG. 2B. The protrusion portion X of bonding window 2 prevents a floating of the lead frame 25A, 25B or 25C during the wire bonding process.

Figure 3:
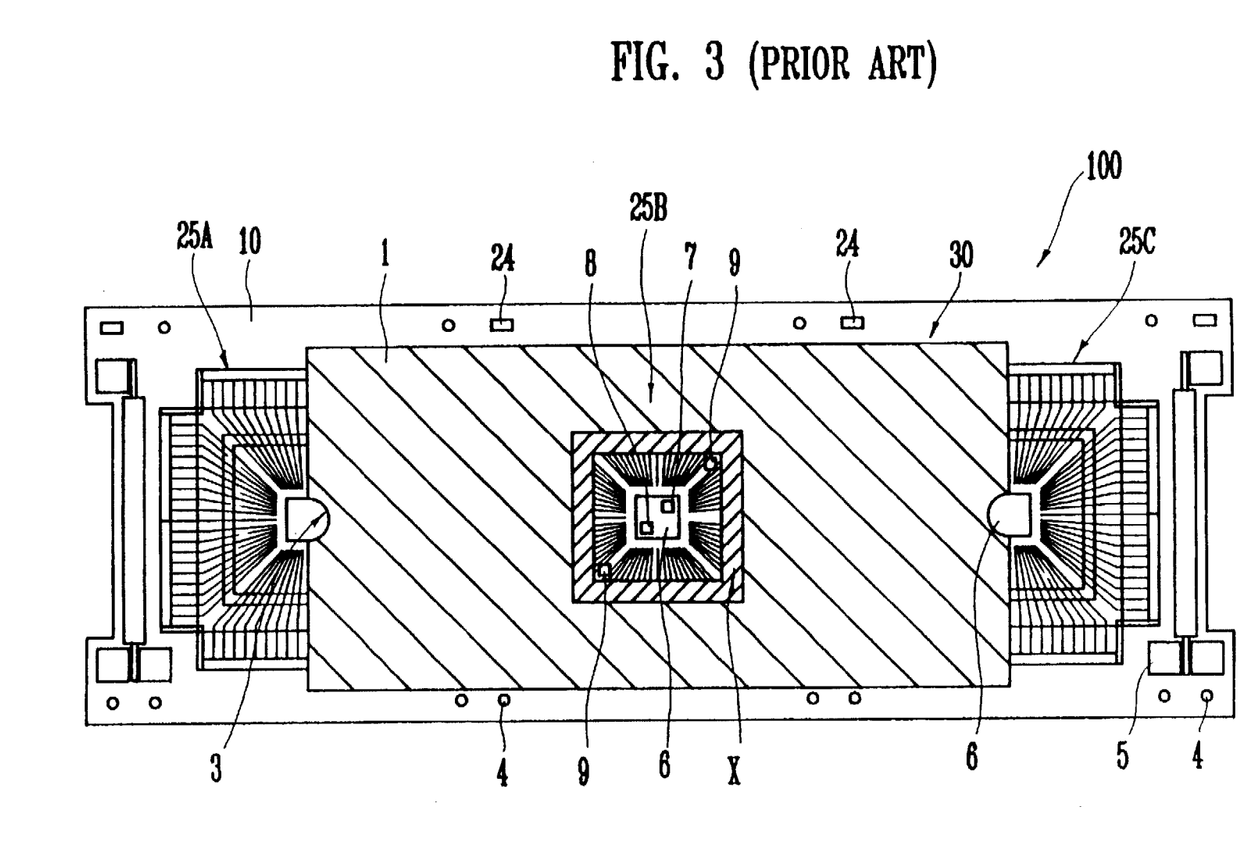
FIG. 3 is a plan view to illustrate a method of alignment of a lead frame strip utilizing a conventional window clamp shown in FIG. 2A.

Hereinafter, a method for alignment of lead frame strip is described with reference to FIG. 3. When the lead frame strip 10 of which the dies 6 are attached on the die attaching regions 16 of the lead frames 25A, 25B and 25C respectively, is loaded into the wire bonding equipment, the window clamp 30 is placed on the lead frame strip 100, therefore, the inner leads of the lead frame 25B and the die attached on die attaching region of the lead frame 25B are exposed through the bonding window 2 of the window clamp 30. In this condition, the alignment condition of the lead frame strip 100 is achieved by a sensor equipped in the wire bonding equipment. The sensors sense two opposed corners, that is, a first and second die sensing regions 7 and 8 of the die 6 and two opposed corners, that is, lead sensing regions 9, of the leads of the lead frame 25B exposed through the bonding window 2 of window clamp 30. The sensors respond to the presence of the die 6 and the leads of the lead frame 26B. If the sensors indicate no presence of the die 6 in the first and second die sensing regions 7 and 8 or leads in the lead sensing regions 9, the wire bonding equipment generates an error signal so as to realign the position of the lead frame strip 100. Since the sensor has no sensibility of direction but only senses the presence of the die 6 and the leads of the lead frame 25B(or 25A, 25C), in case where the lead frame strip 100 is loaded into the wire bonding equipment in reversed direction, if only the position of the lead frame strip 100 is consistent to some extent, the wire bonding equipment judges that the alignment of the lead frame strip 100 is completed and proceeds subsequent wire bonding process. Although a guide pin or sensor is used to sense the direction of the lead frame strip 100, since the portions which make the lead frame strip 100 have the property of direction, for example, the circular pin holes 4, the rectangular pin holes 25 and the gate holes 5 vary with the kind of lead frame strip 100, a lot of time is required to set the sensors to their portions and the setting is no precise so that the rate of occurrence of poor quality is high.

Therefore, the object of this invention is to provide a window clamp and method of alignment of lead frame strip utilizing the same which can resolve the above described disadvantages by sensing an alignment condition of a die and a lead frame by utilizing a window clamp formed with a bonding window and lead sensing window and utilizing a sensing means equipped in a wire bonding equipment.

SUMMARY OF THE INVENTION

A window clamp of the present invention to achieve the above described object is characterized in that it comprises a flat portion for covering one of said lead frames of the lead frame strip and a portion of the another lead frames placed at both side of said lead frame; a bonding window formed at the center of said flat portion to expose a portion of said lead frame to be bonded and said die attached on said die attaching region of said lead frame; a lead sensing window formed on said flat portion to expose a predetermined portion including said gate hole adjacent said lead frame; two fixing recesses formed at both sides of said flat portion to be fixed by bolts or pins; and a protruding portion formed at said flat portion around said bonding window to protrude downwards.

In addition, a method of alignment of a lead frame strip utilizing a window clamp of the present invention is characterized in that it comprises a first step of attaching a die separated from a wafer onto a die attaching region of said lead frame, and therefore, loading said lead frame strip into a wire bonding equipment; a second step of placing said window clamp on said lead frame strip to expose a portion of said lead frame to be bonded and said die through a bonding window of said window clamp consisting of a flat portion for covering one of said lead frames of the lead frame strip and a portion of the another lead frames placed at both side of said lead frame, a bonding window formed at the center of said flat portion to expose a portion of said lead frame to be bonded and said die attached on said die attaching region of said lead frame, a lead sensing window formed on said flat portion to expose a predetermined portion including said gate hole adjacent said lead frame, two fixing recesses formed at both sides of said flat portion to be fixed by bolts or pins, a protruding portion formed at said flat portion around said bonding window to protrude downwards, from said first step; a third step of sensing a first and second die sensing regions exposed through said bonding window formed on said window clamp, and a lead sensing region exposed through said lead sensing window formed on said window clamp by utilizing a sensing means, from said second step; a fourth step of confirming the alignment condition of said die and lead frame form pictures obtained by sensing with said first and second die sensing regions and said lead sensing region, from said third step; a fifth step of re-aligning said lead frame strip, if the alignment condition of said die or said lead frame is poor, and thereafter proceeding to said second step, from said fourth step; a sixth step of performing a wire bonding if the alignment condition of said die and lead frame is good, and thereafter completing the wire bonding process.

BRIEF DESCRIPTION OF THE DRAWINGS

Other objects and advantages of the present invention will be understood by reading the detailed explanation of embodiments with reference to the accompanying drawings in which.

DETAILED DESCRIPTION OF PREFERRED EMBODIMENTS

A detailed description of the present invention is given below with reference to the accompanying drawings.

Figure 4A:
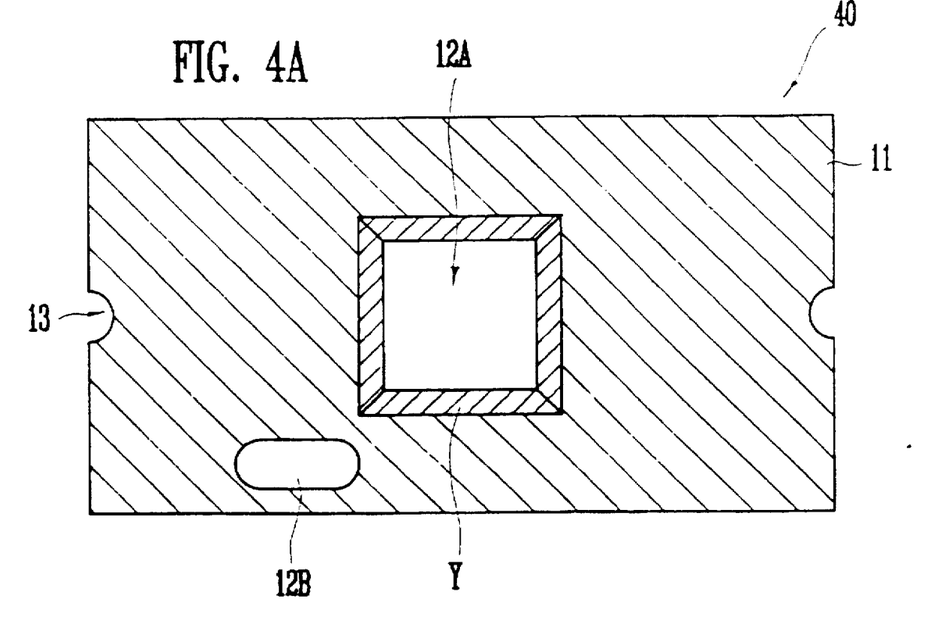
FIG. 4A and FIG. 4B are plan views to illustrate the first and second embodiments of the window clamp according to the present invention.
Figures 4B, 5B, 5C:
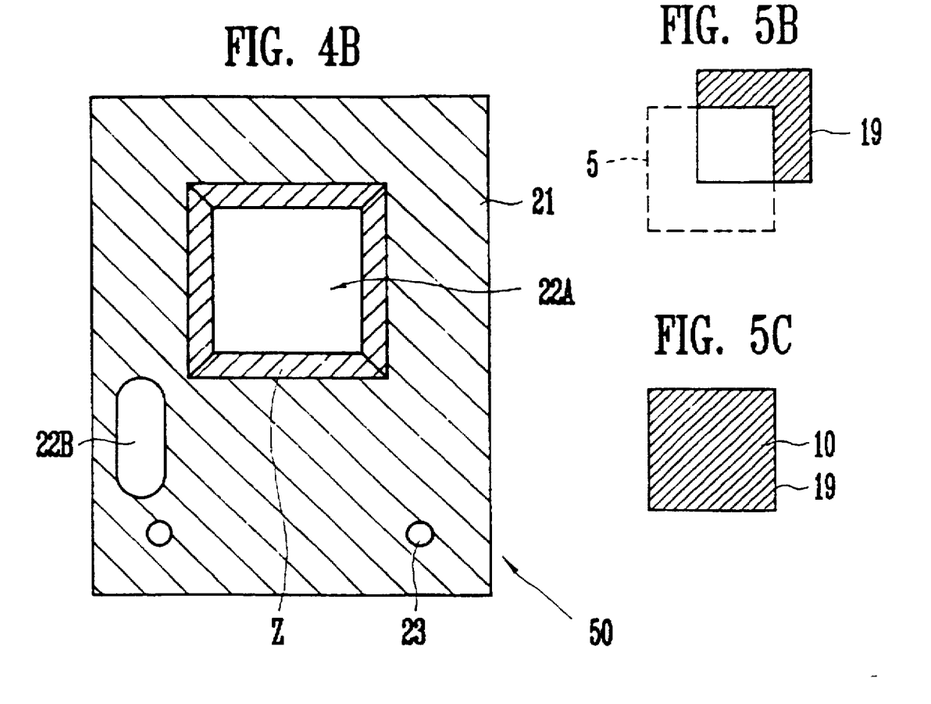
FIGS. 5A through 5C are plan views to illustrate the method of alignment of the lead frame strip utilizing the window clamp of FIG. 4A.

FIG. 4A and FIG. 4B are plan views to illustrate a first and second embodiments of the window clamp according to the present invention and will be explained with FIG. 1.

As shown in FIG. 4A, a window clamp 40 according to the first embodiment of the present invention consists a flat portion 11 for covering a portion including one lead frame, for example 25B, of the lead frame strip 100 shown in FIG. 1 and a part of other lead frames 25A and 25C formed at both sides of one said lead frame 25B, a bonding window 12A formed in a shape of rectangle at the center of the flat portion 11 to expose a portion of the lead frame 25B to be bonded and the die attaching region, a lead sensing window 12B formed on the flat portion 11 to expose a predetermined portion including a gate hole adjacent the lead frame 25B, tow fixing recesses 13 formed at both sides of the flat portion 11 to be fixed by bolts or pins, and a protruding portion Y formed at the flat portion 11 around the bonding window 12A to protrude downwards. The protruding portion Y is to prevent a floating up of the lead frame 25B at the time of wire bonding. In addition, a window clamp 50 according the second embodiment of the present invention consists of, as shown in FIG. 4B, a flat portion 21 for covering a portion including on lead frame, for example 25B, of the lead frame strip 100, a bonding window 22A formed in a shape of rectangle at the center of the flat portion 21 to expose a portion of the lead frame 25B to be bonded and the die attaching region 16, a lead sensing window 22A formed on the flat portion 21 to expose a predetermined portion including a gate hole 5 adjacent the lead frame 25B, tow fixing holes 23 formed at both sides at the bottom of the flat portion 21 to be fixed by bolts or pins, and a protruding portion Z formed at the flat portion 21 around the bonding window 22A to protrude downwards. The protruding portion Z is to prevent a floating up of the lead frame 25B at the time of wire bonding process. Now, a method of alignment of the lead frame strip 100 loaded in the wire bonding equipment by utilizing the window clamp 40 or 50 is described below.

Figure 5A:
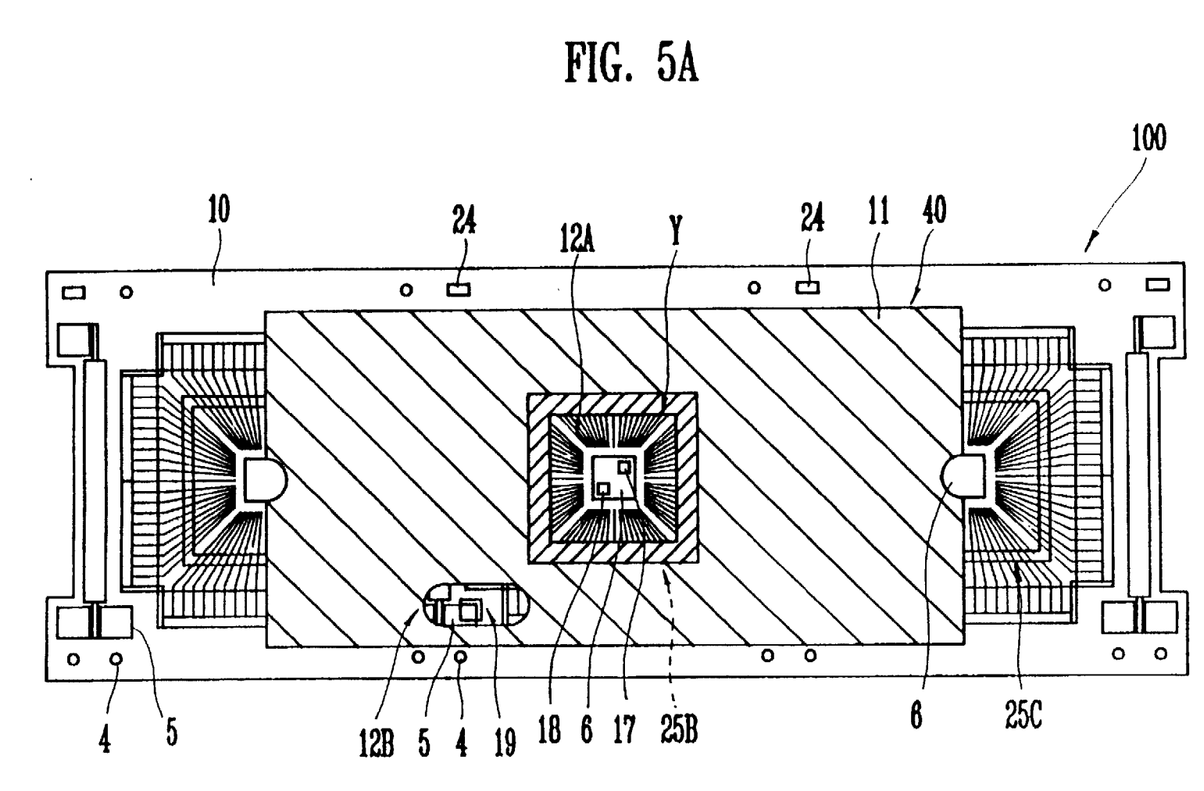
Figure 6:
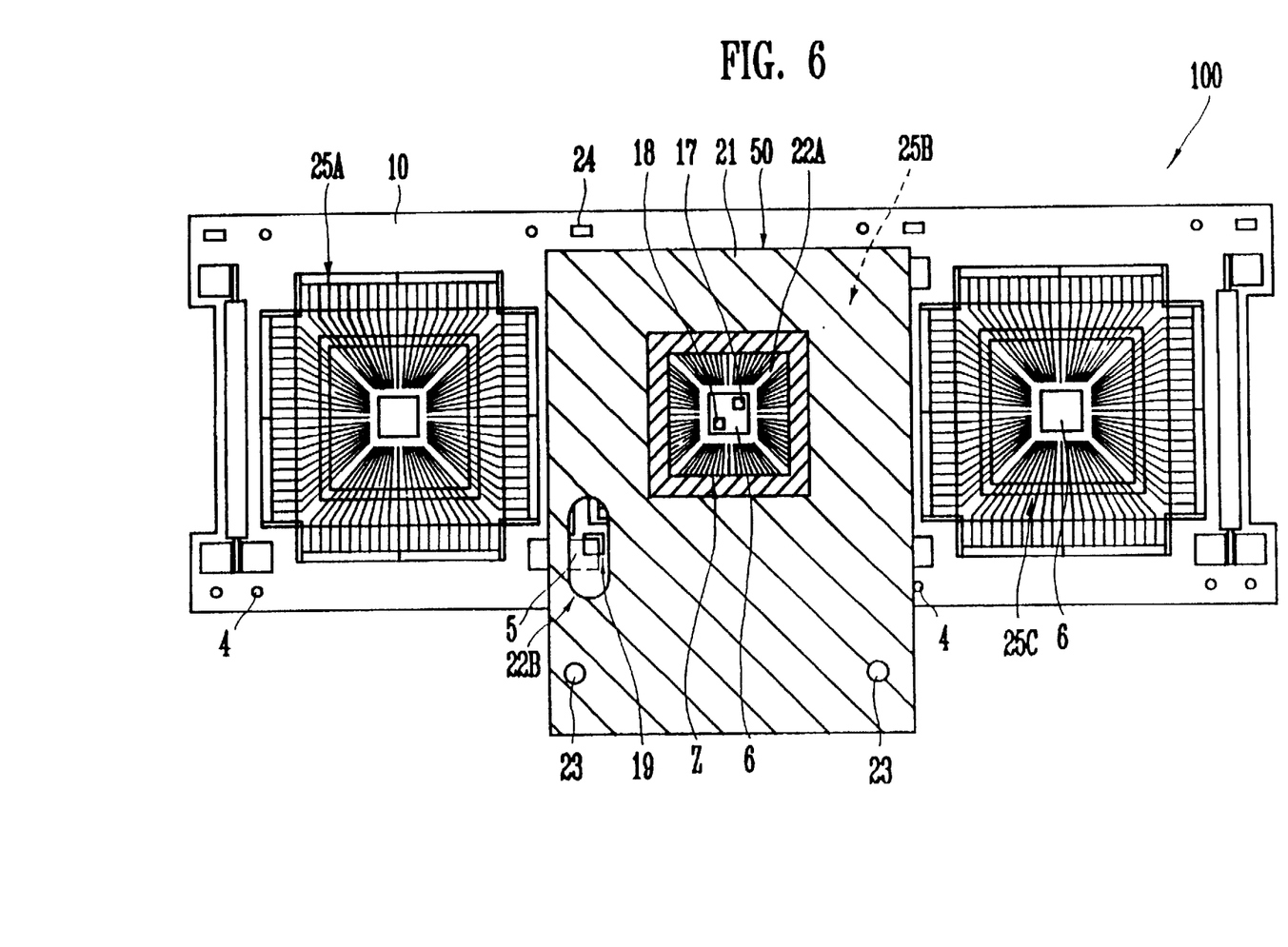
FIG. 6 is a plan view to illustrate the method of alignment of the lead frame strip utilizing the window clamp of FIG. 4B.

FIGS. 5A through 5C are plan views to illustrate the method of alignment of the lead frame strip utilizing the window clamp of FIG. 4A. FIG. 6 is a plan view to illustrate the method of the lead frame strip utilizing the window clamp of FIG. 4B, and they will be described with reference to FIG. 7.

If the lead frame strip 100 of which a die 6 is attached on the die attaching region 16 as shown in FIG. 1 is loaded into the wire bonding equipment, the window clamp 40 is placed on the lead frame strip 100 as shown in FIG. 5A. At this time, a portion of the lead frame, for example 25B, to be bonded and the die 6 are exposed by the bonding window 12A of the window clamp 40. In this condition, the alignment condition of the lead frame strip 100 is sensed. The alignment condition of the lead frame strip 100 is achieved by sensing a lead sensing region 19 exposed through the lead sensing window 12B, that is, a portion including one gate hole 5 adjacent the lead frame 25B and a part of the side rails on the periphery of the gate hole 5, and a first and second die sensing regions 17 and 18 exposed through the bonding window 12A, that is, two opposing corner portions of the die 6, through sensing means. The sensing means are picture identifying cameras set on the wire bonding equipment. Here, in case where the direction of the lead frame strip 100 i s loaded precisely, an overlapping portion of the lead sensing region 19 and the gate hole 5 appear to have constant size, as shown in FIG. 5B, in the picture obtained through sensing means set to sense the lead sensing region 19. Therefore, the subsequent wire bonding can be performed. In addition, in case where the direction of the lead frame strip 100 is loaded in reverse direction, there is no overlapping portions of the lead sensing region 19 and the gate hole 5, therefore, only a side rail 10 appears as shown in FIG. 5C in t he pictures obtained through sensing means set to sense the lead sensing region 19. Then, the lead frame strip 100 is correctly re-aligned and the lead sensing region 19 and the first and second die sensing regions 17 and 18 are sensed again. Such method of aligning the lead frame strip obtains the same result even if it is performed after the window clamp 50 shown in FIG. 4B is placed vertical to the lead frame strip 100 as in FIG. 6.

The above described method of alignment of the lead frame strip utilizing the window clamp of the present can be more simply described with reference to FIG. 7.

Figure 7:
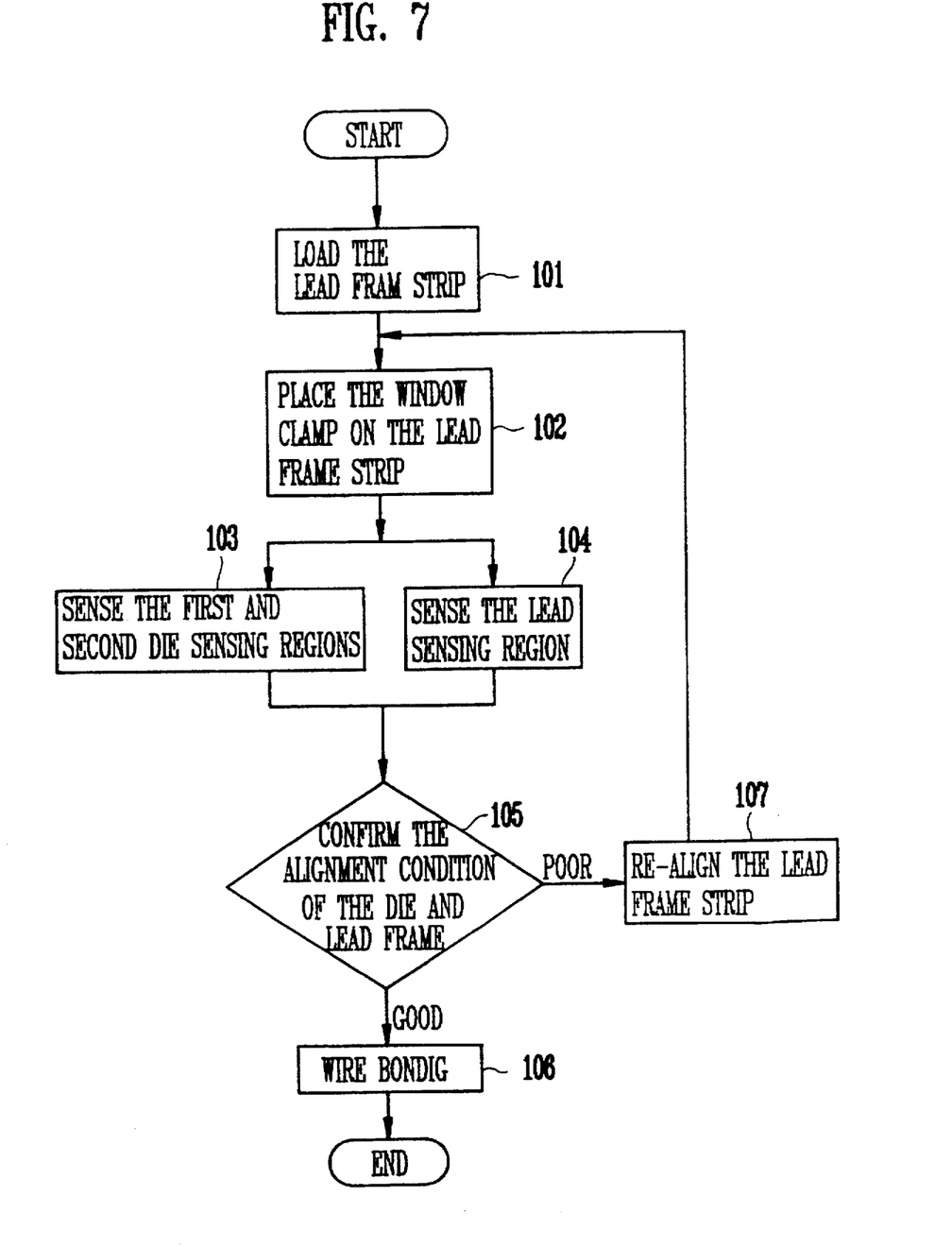
FIG. 7 is a flow chart to illustrate the method of alignment of the lead strip according to the present invention.

FIG. 7 is a flow chart to illustrate the method of alignment of the lead strip according to the present invention. In the step of start and step 101, a lead frame strip 100 of which a die 6 is attached on the die attaching region 16 is loaded into the wire bonding equipment, then proceeding to step 102, the window clamp 40 or 50 is placed on said lead frame strip 100 so that a portion of the lead frame, for example 25B, to be bonded and the die 6 are exposed by the bonding window 12A or 22A. Proceeding from the step 102 to the steps 103 and 104, the first and second die sensing regions 17 and 18 exposed through the bonding window 12A or 22A formed on the window clamp 40 or 50, and the lead sensing region 19 exposed through the lead sensing window 12B or 22B formed on the window clamp 40 or 50 are sensed by utilizing the sensing means. Proceeding from the steps 103 and 104 to the step 105, the alignment condition of the die 6 and lead frame 25B is confirmed from pictures obtained by sensing with the first and second die sensing regions 17 and 18, thereafter, if the alignment condition of the die 6 or the lead frame 25B is poor, proceeding to step 107, the lead frame strip 100 is re-aligned, then proceeding again to step 102. If, at the step 105, the alignment condition of the die 6 and the lead frame 25B is good, proceeding to step 106, the wire bonding is performed and the process is completed. Here, the picture identifying camera set on the wire bonding equipment is used as the sensing means.

According to the present invention as described above, there are excellent effects that the occurrence of poor quality at the time of wire bonding can be prevented by sensing an alignment condition of a die and a lead frame by utilizing a window clamp formed with a bonding window and a lead sensing window and by utilizing a sensing means set on a wire bonding equipment, an that a yield can be increased by reducing the required time than the prior art at the time of alignment of the lead frame strip by sensing only the first and second die sensing regions and the lead sensing region.

Many modifications and variations may be made in the techniques and structure described and illustrated herein without departing from the spirit and scope of the present invention. Accordingly, it should be understood that the techniques and structures described and illustrated herein are illustrative only and are not to be considered as limitations upon the scope of the present invention.

What is claimed is:

1. A window clamp placed on a lead frame strip at a time of wire bonding, said lead frame strip having a plurality of lead frames, side rails, a plurality of circular and rectangular pin holes and plurality of gate holes, said each lead frame having a die attaching region and a plurality of leads, comprising:

a flat portion covering one of said lead frames of the lead frame strip and a portion of another of said lead frames, said flat portion placed at both sides of said lead frame;

a bonding window formed at a center of said flat portion to expose a portion of said lead frame to be bonded and said die attached on said die attaching region of said lead frame;

a lead sensing window formed on said flat portion for exposing a predetermined portion including said gate hole adjacent said lead frame when a loading direction of said lead frame strip has a predetermined orientation;

two fixing recesses, formed at respective sides of said flat portion to be fixed by one of bolts or pins; and a protruding portion formed at bottom surface of said flat portion around said bonding window.

2. The window clamp of claim 1, wherein said bonding window has a shape of rectangle.

3. A window clamp placed on a lead frame strip at a time of wire bonding, said lead frame strip having a plurality of lead frames, side rails, a plurality of circular and rectangular pin holes and plurality of gate holes, said each lead frame consisting of a die attaching region and a plurality of leads, comprising:

a flat portion for covering one of said lead frames of the lead frame strip;

a bonding window formed at a center of said flat portion to expose a portion of said lead frame to be bonded and said die attached on said die attaching region of said lead frame;

a lead sensing window formed on said flat portion for exposing a predetermined portion including said gate adjacent said lead frame when the loading direction of said lead frame strip is correct;

two fixing recesses formed at both sides of bottom of said flat portion to be fixed by bolts or pins; and a protruding portion formed at bottom surface of said flat portion around said bonding window.

4. The window clamp of claim 3, wherein said bonding window has a shape of rectangle.

* * * * *